(12) United States Patent
Sung et al.

(10) Patent No.: US 7,102,919 B1
(45) Date of Patent: Sep. 5, 2006

(54) METHODS AND DEVICES FOR DETERMINING WRITING CURRENT FOR MEMORY CELLS

(75) Inventors: Hung-Cheng Sung, Baoshan, Hsinchu (TW); Der-Shin Shyu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 11/078,171

(22) Filed: Mar. 11, 2005

(51) Int. Cl.
*G11C 11/00* (2006.01)
(52) U.S. Cl. .................................. 365/158; 365/225.5
(58) Field of Classification Search ............... 365/158, 365/225.5
See application file for complete search history.

(56) References Cited

U.S. PATENT DOCUMENTS 6,545,906 B1 * 4/2003 Savtchenko et al. ........ 365/158
6,760,266 B1 * 7/2004 Garni et al. ................. 365/209
6,967,366 B1 * 11/2005 Janesky et al. ............. 257/295

* cited by examiner

*Primary Examiner*—Tuan T. Nguyen
(74) *Attorney, Agent, or Firm*—Thomas, Kayden, Horstemeyer & Risley

(57) ABSTRACT

Methods for determining writing current for memory cells. A first reference current is applied to a first operative line to switch the memory cell to a first state. A second reference current is applied to a second operative line crossing the first operative line to switch the memory cell to a second state. A first writing current is obtained according to a first ratio and the first reference current. A second writing current is obtained according to a second ratio and the second reference current. The memory cell is programmed by applying the first writing current to the first operative line and applying the second writing current to the second operative line.

22 Claims, 11 Drawing Sheets

METHODS AND DEVICES FOR DETERMINING WRITING CURRENT FOR MEMORY CELLS

BACKGROUND

The disclosure relates in general to Magnetoresistive Random Access Memory (MRAMs), and more particularly to methods and devices to determinate writing current for MRAM cells.

Magnetic random access memory (MRAM) cells are often based on a magnetic tunnel junction (MTJ) cell. Basically, an MTJ configuration can be made up of three basic layers, a "free" ferromagnetic layer (free layer), an insulating tunneling barrier, and a "pinned" ferromagnetic layer (pinned layer). In the free layer, the magnetization moments are free to rotate under an external magnetic field, but the magnetic moments in the "pinned" layer cannot. The pinned layer can be composed of a ferromagnetic layer and/or an anti-ferromagnetic layer which "pins" the magnetic moments in the ferromagnetic layer. A very thin insulation layer forms the tunneling barrier between the pinned and free magnetic layers. In order to detect states in the MTJ configuration, a constant current can be applied through the cell. As the magneto-resistance varies according to the state stored in the cell, the voltage can be detected over the memory cell. To write or change the state of the memory cell, an external magnetic field can be applied, sufficient to completely switch the direction of the magnetic moments of the free magnetic layers.

MTJ configurations often employ the Tunneling Magneto-Resistance (TMR) effect, which allows magnetic moments to quickly switch the directions in the magnetic layer by an application of an external magnetic field. Magneto-resistance (MR) is a measure of the ease with which electrons flow through the free layer, tunneling barrier, and the pinned layer. A minimum MR occurs in an MTJ configuration when the magnetic moments in both magnetic layers have the same direction or are "parallel". A maximum MR occurs when the magnetic moments of both magnetic layers are in opposite directions or are "anti-parallel."

FIG. 1A is a schematic perspective view illustrating a conventional MTJ memory cell of an MRAM device. FIG. 1B is a schematic perspective view illustrative of read out operation of the MTJ memory cell of FIG. 1A. FIG. 1C is a plane view illustrative of respective magnetization states depending on stored data of the MTJ memory cell of FIG. 1A.

A single memory cell comprises first operative layer 11, pinned layer 12, tunnel barrier layer 13, free layer 14, and second operative layer 15. The MTJ memory cell comprises pinned layer 12, dielectric layer 13, and free layer 14. The tunnel barrier layer 13 is sandwiched between pinned layer 12 and free layer 14. The pinned layer 12 is in contact with the first operative layer 11. The free layer 14 is in contact with the second operative layer 15. The pinned layer 12 and the free layer 14 are ferromagnetic materials. The dielectric layer 13 is an insulating material. The pinned layer 12 has a fixed magnetization direction. The dielectric layer 13 has a thickness of about 1.5 nanometers. The free layer 14 has a thickness of about 20 nanometers. The free layer 14 has a freely changeable magnetization direction.

The magnetization direction of the free layer 14 indicates stored data. The free layer 14 serves as a data storage layer. The first operative layer 11 and the second operative layer 15 extend in directions perpendicular to each other. The MTJ memory cell is positioned at a crossing point between the first operative layer 11 and the second operative layer 15. In FIG. 1B, a current 16 flows from the first operative layer 11 to the second operative layer 15 through the pinned layer 12, the dielectric layer 13, and the free layer 14. The MTJ memory cell is capable of storing binary digit data "0" and "1". If the magnetization directions of the pinned layer 12 and the free layer 14 are parallel to each other, the MTJ memory cell stores a first binary digit, for example, "0". If the magnetization directions of the pinned layer 12 and the free layer 14 are not parallel, the MTJ memory cell stores a second binary digit, for example, "1". The magnetization direction of the free layer 14 changes depending on an externally applied magnetic field.

Electrical resistance of the dielectric layer 13 varies by about 10–60% due to tunneling magnetoresistance effect between a first state where the magnetization directions of the pinned layer 12 and the free layer 14 are parallel and a second state where the magnetization directions of the pinned layer 12 and the free layer 14 are not parallel. A predetermined potential difference or a predetermined voltage is applied to the first and second operative layers 11 and 15 to apply a tunneling current from the pinned layer 12 to the free layer 14 through the dielectric layer 13. This tunneling current varies depending on the variable electrical resistance of the dielectric layer 13 due to tunneling magnetoresistance. Data can be retrieved from the MTJ memory cell by detecting the variation in the tunneling current.

FIG. 2A is a fragmentary schematic perspective view illustrative of an array of MTJ memory cells. FIG. 2B is a fragmentary schematic perspective view illustrative of the array of the MTJ memory cells during the operation shown in FIG. 2A.

The first operative layers 11 extend parallel to each other in a first direction. The second operative layers 15 extend parallel to each other in a second direction, perpendicular to the first direction. The single first operative layer 11 and the single second operative layer 15 have a single crossing point, where a single MTJ memory cell "C" is provided. The first operative layers 11 and the second operative layers 15 have an array of crossing points where plural MTJ memory cells "C" are provided. The first operative layers 11 serve as word lines. The second operative layers 15 serve as bit lines. One of the plural MTJ memory cells "C" is selected by selecting one of the word lines and one of the bit lines, for read or write operations to the selected MTJ memory cell "C".

The MRAM has the array of the MTJ memory cells, each of which comprises the tunneling magnetoresistance element utilizing the tunneling magnetoresistance effect, wherein the tunneling magnetoresistance element includes an insulating thin film sandwiched between the two or more ferromagnetic thin films. The tunneling magnetoresistance element is switched between a first state, in which the magnetization directions of the two ferromagnetic thin films are parallel to each other, and a second state, in which the magnetization directions of the two ferromagnetic thin films are anti-parallel. The resistance of the insulating film, detected the tunneling current, is different for the first and second states. These two states correspond to binary digits, for example, the first state can correspond to data "0", and the second state to data "1".

The write operation is accomplished as follows. One of the word lines 11 and one of the bit lines 15 are selected. A first write current Isw is applied to the selected word line 11s. A first magnetic field Msw is generated around the selected word line 11s. The first write current Isw has a predetermined current value and a predetermined direction.

A second write current Isb is applied to the selected bit line 15s. The second write current Isb has a predetermined current value and a predetermined direction. A second magnetic field Msb is generated around the selected bit line 15s. As a result, a superimposed magnetic field of both the first and second magnetic field Msw and Msb is applied to the crossing point of the selected word line 11s and the selected bit line 15s. The selected MTJ memory cell "Cs" is positioned at the crossing point of the selected word line 11s and the selected bit line 15s, for which reason the selected MTJ memory cell "Cs" is applied with the superimposed magnetic field. The free layer of the selected MTJ memory cell "Cs" is also applied with the superimposed magnetic field, whereby magnetic domains of the free layer become ordered in a first direction, for example, parallel to the magnetization direction of the pinned layer. As a result, the selected MTJ memory cell "Cs" stores a binary digit data "0".

Any first write current Isw or second write current Isb changes its current direction to an opposite direction, whereby the direction of the magnetic field is inverted, and the direction of the superimposed magnetic field is changed by approximately 90 degrees. As a result, the magnetic domains of the free layer become ordered in a second direction, for example, in a direction anti-parallel to the magnetization direction of the pinned layer. As a result, the selected MTJ memory cell "Cs" stores another binary digit "1".

The read operation is accomplished as follows. One of the word lines 11 and one of the bit lines 15 are selected. A potential difference is applied between the selected word line 11s and the selected bit line 15s for measuring a current value to detect a resistance value of the selected memory cell "Cs" to the tunneling current. Namely, a predetermined potential difference or a predetermined voltage is applied to the selected word line 11s and the selected bit line 15s to provide a tunneling current from the pinned layer through the insulating layer to the free layer of the selected memory cell "Cs". This tunneling current varies depending on the variable electrical resistance of the insulating layer due to the tunneling magnetoresistance effect. The binary digit data can be detected from the selected memory cell "Cs" by detecting the variation in the tunneling current.

As described, the ability of this type of cell to store electrically accessible data hinges on electron tunneling between the free layer and the pinned layer, which in turn is dependent on the relative directions of magnetization of these two regions. Rotating the magnetization in the free layer into one of at least two selectable directions results in binary state stored in the cell. If the cell is oriented with its magnetic easy-axis ("EA") horizontal, an electrical writing current through a vertical line will apply an EA magnetic field, and a current through a horizontal line will apply a hard-axis ("HA") magnetic field, to the cell.

In one implementation of MRAM cells, the writing of individual cells adheres to a concept referred to as the "asteroid" for switching. The switching threshold of a single free region depends on the combination of EA and HA magnetic fields applied thereto. This "Stoner-Wohlfarth" asteroid model, shown in FIG. 3A, illustrates these threshold values in the plane of applied EA and HA fields. Switching occurs when a combination of EA and HA fields at the cell results in a vector outside of the asteroid curve. Vectors inside the asteroid curve will not switch the cell from one of its current bi-stable states. This asteroid model also illustrates how the EA field needed to switch a device is reduced in the presence of an HA bias field. Selectively switching a single cell within the array is achieved by applying electrical currents through a selected pair of horizontal and vertical lines. These currents generate a combination of EA and HA fields only at the cell located at the intersection of these lines, theoretically switching the selected cell, but not the neighboring cells.

All the cells along the horizontal line experience the same applied HA field. Similarly all the cells along the vertical line experience the same applied EA field. However, only the cell at the intersection of these lines experiences the combination of both fields necessary for switching.

Problems arise when the thresholds of the asteroid curve vary from cell to cell, and from hysteresis loop to hysteresis loop in the same cell. This leads to a broadening of the asteroid into a band of threshold values as shown in FIG. 3B. Since the ability to selectively switch cells hinges on all cells except one along a line not being switched under a single applied HA or EA field, if this band of the asteroid curve broadens excessively, it is no longer possible to selectively write individual cells, with equivalent writing stimuli, since other non-selected cells along the lines will also switch. In other words, if the magnetic field generated by writing lines is too weak or the switching field for the magnetoresistive cell is too large, writing operation cannot be successful. In addition, if the magnetic field generated by writing lines is too strong or the switching field for the magnetoresistive cell is too small, writing disturb occurs on the on-wanted cells.

Whether using the above-discussed asteroid selection model, or any other selection model, a major challenge in the successful implementation of an MRAM array with effective cell selectivity is the fabrication of many memory cells with nearly identical electrical and magnetic properties. This is particularly difficult for magnetic devices since their response is sensitive not only to local defects but also to edge or surface roughness.

SUMMARY

Methods and devices for determining writing current for memory cells are provided. An embodiment of the memory device comprises: a first operative line; a memory cell; a writing adjustment unit operative to generate a first parameter representing a first ratio of a first reference current, and generate an initial signal; and a program/erase control unit operative to switch the memory cell to a second state in response to the initial signal, provide the first reference current to the first operative line to switch the memory cell to a first state, and provide a first writing current according to the first ratio and the first reference current to the first operative line to switch the memory cell to the first state or the second state.

An embodiment of an MRAM memory device comprises: an MRAM array comprising a plurality of first operative lines, a plurality of second operative lines crossing the first operative lines, a plurality of magnetic tunnel junction memories, each of the plurality of magnetic tunnel junction memories comprising a pinned layer, a free layer, and a non-magnetic layer located between the pinned layer and the free layer, and being positioned at a crossing point of the first operative line and the second operative line; a writing adjustment unit operative to generate a first parameter representing a first ratio of a first reference current and a second parameter representing a second ratio of a second reference current, and generate an initial signal before generating the first reference current and the second reference current; and a program/erase control unit operative to switch the magnetic tunnel junction memory to a second state in response to the initial signal, provide the first reference current to the first operative line to generate a first magnetic field to switch the magnetic tunnel junction memory to a first state, provide the second reference current to the second operative line to generate a second magnetic field to switch the magnetic tunnel junction memory to the first state, provide a first writing current according to the first ratio and the first reference current to the first operative line, and provide a second writing current according to the second ratio and the second reference current to the second operative line to switch the magnetic tunnel junction memory to the first state or the second state.

An embodiment of a method for determining writing current for memory cells comprises: applying a first reference current to a first operative line to switch the memory cell to a first state; applying a second reference current to a second operative line crossing the first operative line to switch the memory cell to a second state; obtaining a first writing current according to a first ratio and the first reference current; obtaining a second writing current according to a second ratio and the second reference current; and programming the memory cell by applying the first writing current to the first operative line and applying the second writing current to the second operative line.

Another embodiment of a method for determining writing current for memory cells comprises: applying a first reference current to a first operative line to switch the memory cell to a first state; applying a second reference current to a second operative line crossing the first operative line to switch the memory cell to a second state; obtaining a first writing current according to a first ratio and the first reference current; obtaining a second writing current according to a second ratio and the second reference current; and programming the memory cell by applying the first writing current to the first operative line and applying the second writing current to the second operative line.

DESCRIPTION OF THE DRAWINGS

The invention will become more fully understood from the detailed description, given hereinbelow, and the accompanying drawings. The drawings and description are provided for purposes of illustration only and, thus, are not intended to be limiting of the present invention.

DETAILED DESCRIPTION

Figure 4:
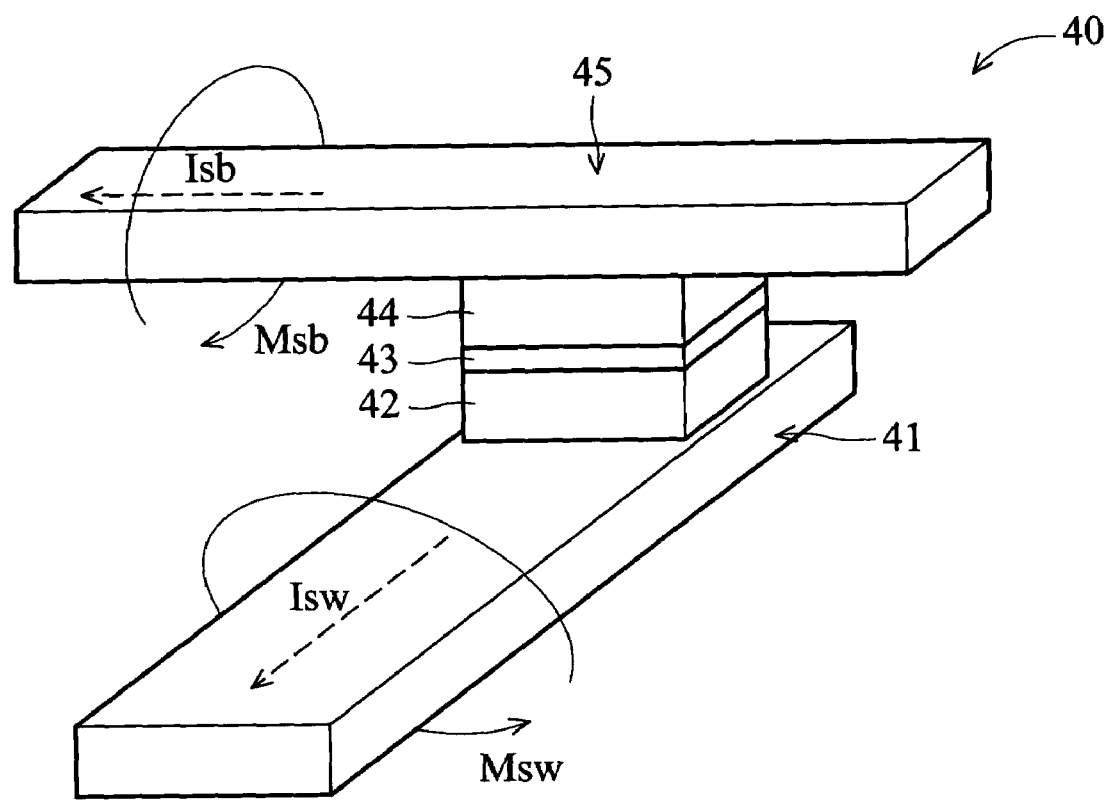
FIG. 4 is a schematic perspective view illustrative of one memory cell of the MRAM device.

FIG. 4 is a schematic perspective view illustrative of one memory cell of the MRAM device. The memory cell comprises a first operative layer 41, an MTJ memory cell 40, and a second operative layer 45. The MTJ memory cell 40 comprises the pinned layer 42, the dielectric layer 43, and the free layer 44. The tunnel barrier layer 43 is sandwiched between the pinned layer 42 and the free layer 44. The pinned layer 42 is in contact with the first operative layer 41. Here, the first and second operative layers may comprise metal, metal alloy, metal compound, silicon or silicide, and the first operative layer 41 can be coupled or isolated with the MTJ memory cell 40 in different implementations.

The pinned layer 42 and the free layer 44 are of ferromagnetic materials. The tunnel barrier layer 43 is made of an insulating material. The pinned layer 42 has a fixed magnetization direction. The dielectric layer 43 has a thickness of about 1.5 nanometers. The free layer 44 has a thickness of about 20 nanometers. The free layer 44 has a freely changeable magnetization direction.

The magnetization direction of the free layer 44 indicates stored data. The free layer 44 serves as a data storage layer. The first operative layer 41 and the second operative layer 45 extend in directions substantially perpendicular to each other. The MTJ memory cell 40 is positioned at a crossing point between the first operative layer 41 and the second operative layer 45. The MTJ memory cell 40 is capable of storing binary digit data "0" and "1". If the magnetization directions of the pinned layer 42 and the free layer 44 are parallel to each other, then the MTJ memory cell 40 stores a first binary digit, for example, data "0". If the magnetization directions of the pinned layer 42 and the free layer 44 are not parallel, the MTJ memory cell 40 stores a second binary digit, for example, "1". The magnetization direction of the free layer 44 is changed depending on an externally applied magnetic field.

Electrical resistance of the dielectric layer 43 varies by about 10–300% due to tunneling magnetoresistance between a first state, where the magnetization directions of the pinned layer 42 and the free layer 44 are parallel, and a second state, where the magnetization directions of the pinned layer 42 and the free layer 44 are anti-parallel. A predetermined potential difference or a predetermined voltage is applied to the first and second operative layers 41 and 45 to provide a tunneling current from the pinned layer 42 to the free layer 44 through the dielectric layer 43. This tunneling current varies depending on the variable electrical resistance of the dielectric layer 43 due to tunneling magnetoresistance effect. The data can be retrieved from the MTJ memory cell 40 by detecting the variation in the tunneling current.

During a write operation, the first operative line (word line) 41 and the second operative line (bit line) 45 are selected. A first write current Isw is applied to the selected word line 41. A first magnetic field Msw is generated around the selected word line 41. The first write current Isw has a predetermined current value and a predetermined direction. A second write current Isb is applied to the selected bit line 45. The second write current Isb has a predetermined current value and a predetermined direction. A second magnetic field Msb is generated around the selected bit line 45. As a result, a superimposed magnetic field of both the first and second magnetic fields Msw and Msb is applied to the crossing point of the selected word line 41 and the selected bit line 45. The selected MTJ memory cell 40 is positioned at the crossing point of the selected word line 41 and the selected bit line 45, for which reason the superimposed magnetic field is applied to the selected MTJ memory cell 40. The free layer of the selected MTJ memory cell 40 is also subjected to the superimposed magnetic field, whereby magnetic domains of the free layer become ordered in a first direction, for example, parallel to the magnetization direction of the pinned layer. As a result, the selected MTJ memory cell 40 stores a binary digit data "0".

Figure 1A:
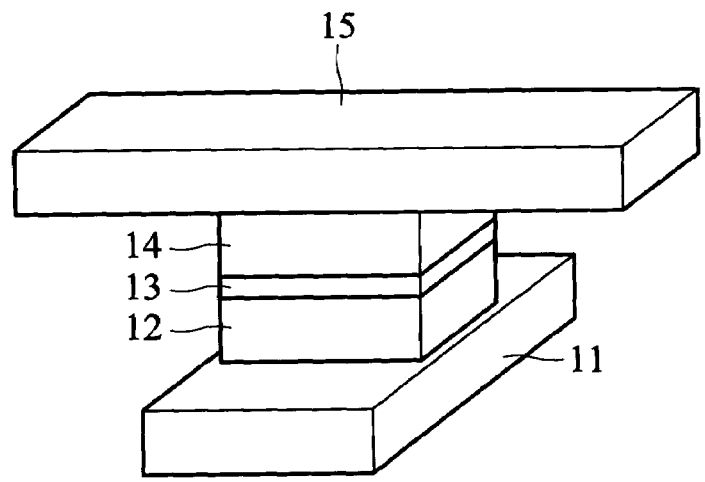
FIG. 1A is a schematic perspective view illustrative of a conventional MTJ memory cell of an MRAM device.
Figure 1B:
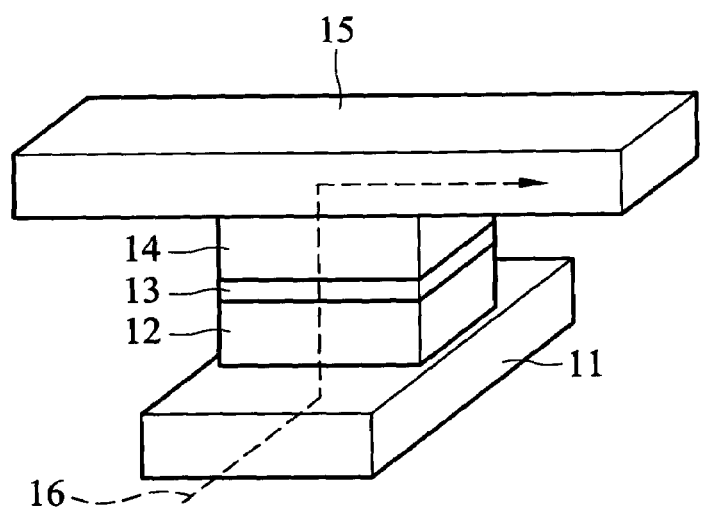
FIG. 1B is a schematic perspective view illustrative of a read out operation of the MTJ memory cell of FIG. 1A.
Figure 1C:
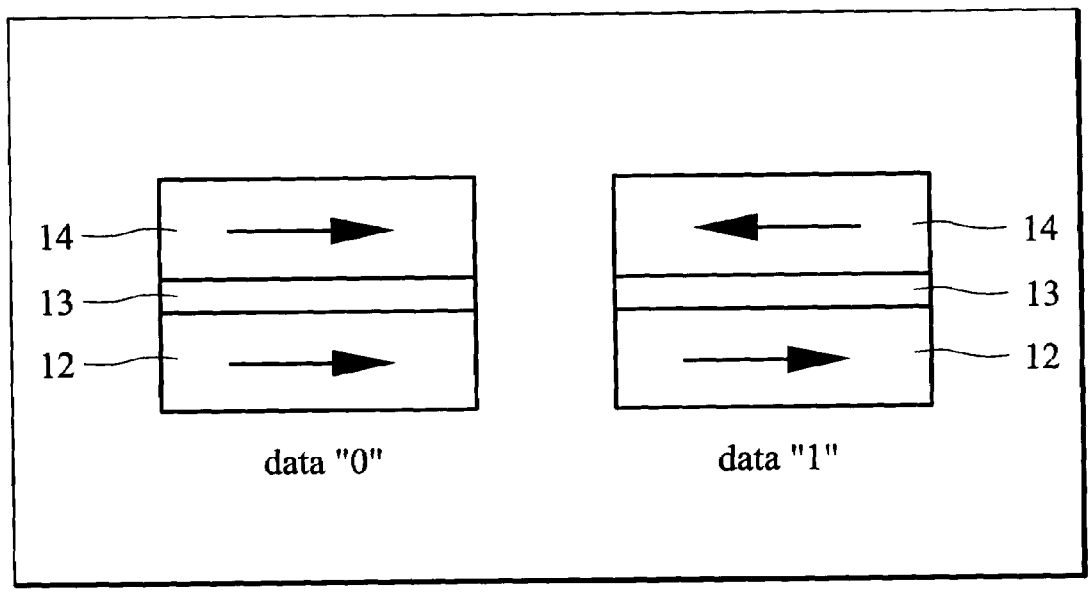
FIG. 1C is a plan view illustrative of respective magnetization states depending on stored data of the MTJ memory cell of FIG. 1A.
Figure 2A:
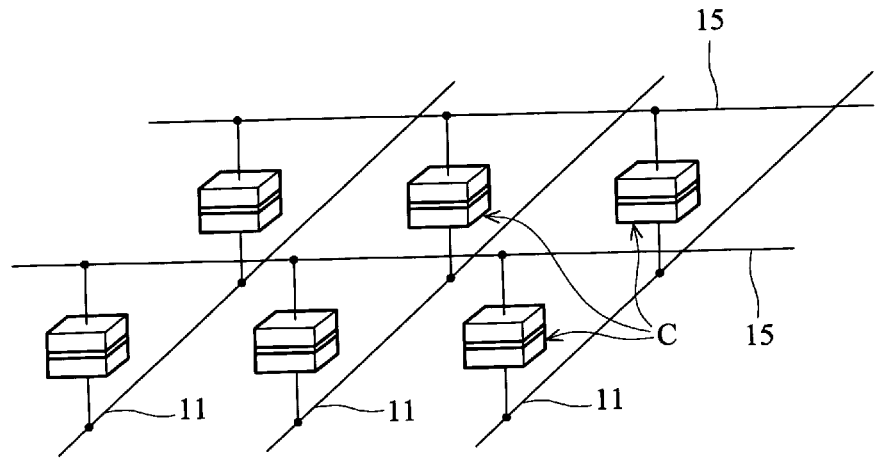
FIG. 2A is a fragmentary schematic perspective view illustrative of an array of MTJ memory cells of the MRAM of FIG. 1A.
Figure 2B:
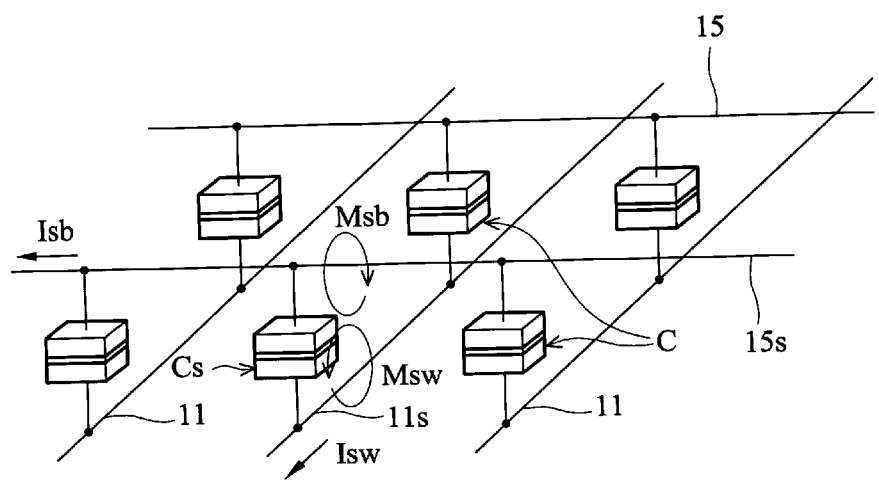
FIG. 2B is a fragmentary schematic perspective view illustrative of the array of the MTJ memory cells during a write operation shown in FIG. 2A.
Figure 3A:
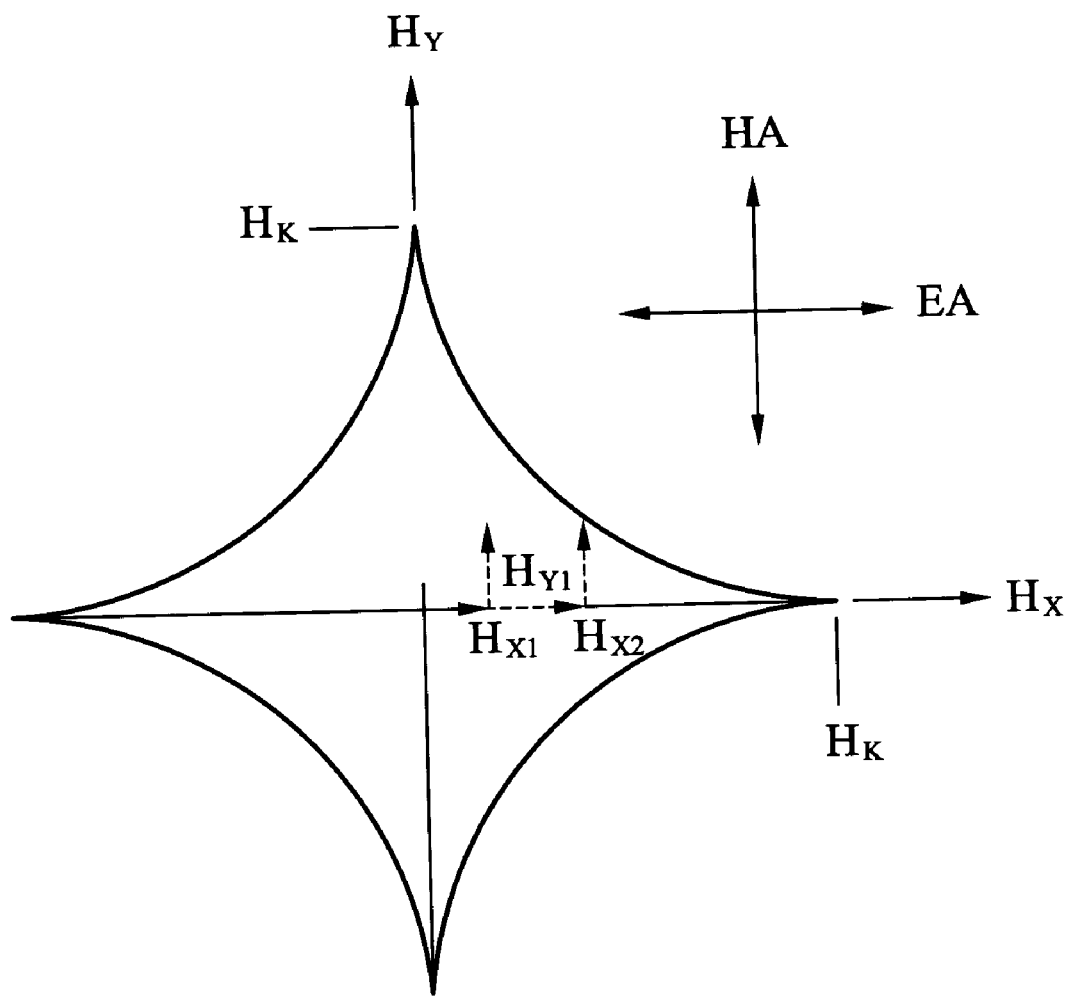
FIG. 3A is an "asteroid" model of the magnetic response of a single, ideal magnetic tunnel junction.
Figure 3B:
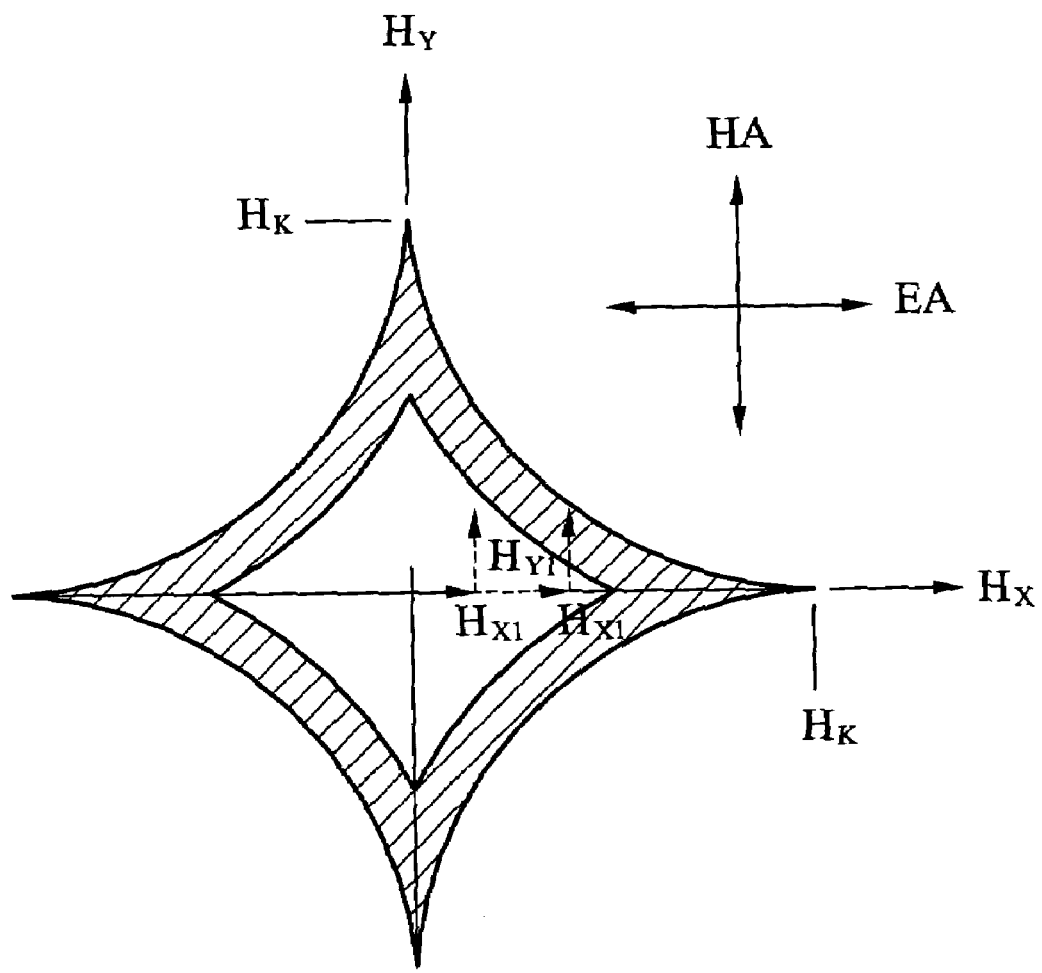
FIG. 3B is an "asteroid" model of the magnetic response of single magnetic tunnel junction cells, each cell having an unpredictable response narrowing the operating window of electrical and magnetic stimuli values able to effectively operate an array of such cells.

FIG. 3A is an asteroid model of the magnetic response of a single, ideal magnetic tunnel junction. As described in FIGS. 3A and 3B, problems arise when the thresholds of the asteroid vary from cell to cell, and from hysteresis loop to hysteresis loop in the same cell, leading to a broadening of the asteroid into a band of threshold values. In addition, the changed operating environment, or process variation also change the range of the asteroid. Since switching of the memory cell occurs when a combination of EA and HA fields at the cell results in a vector outside of the asteroid, and vectors inside the asteroid do not switch the cell from one of its current bi-stable states, it is important to determine a proper first and second magnetic fields Msw and Msb for writing memory cells.

Figure 5:
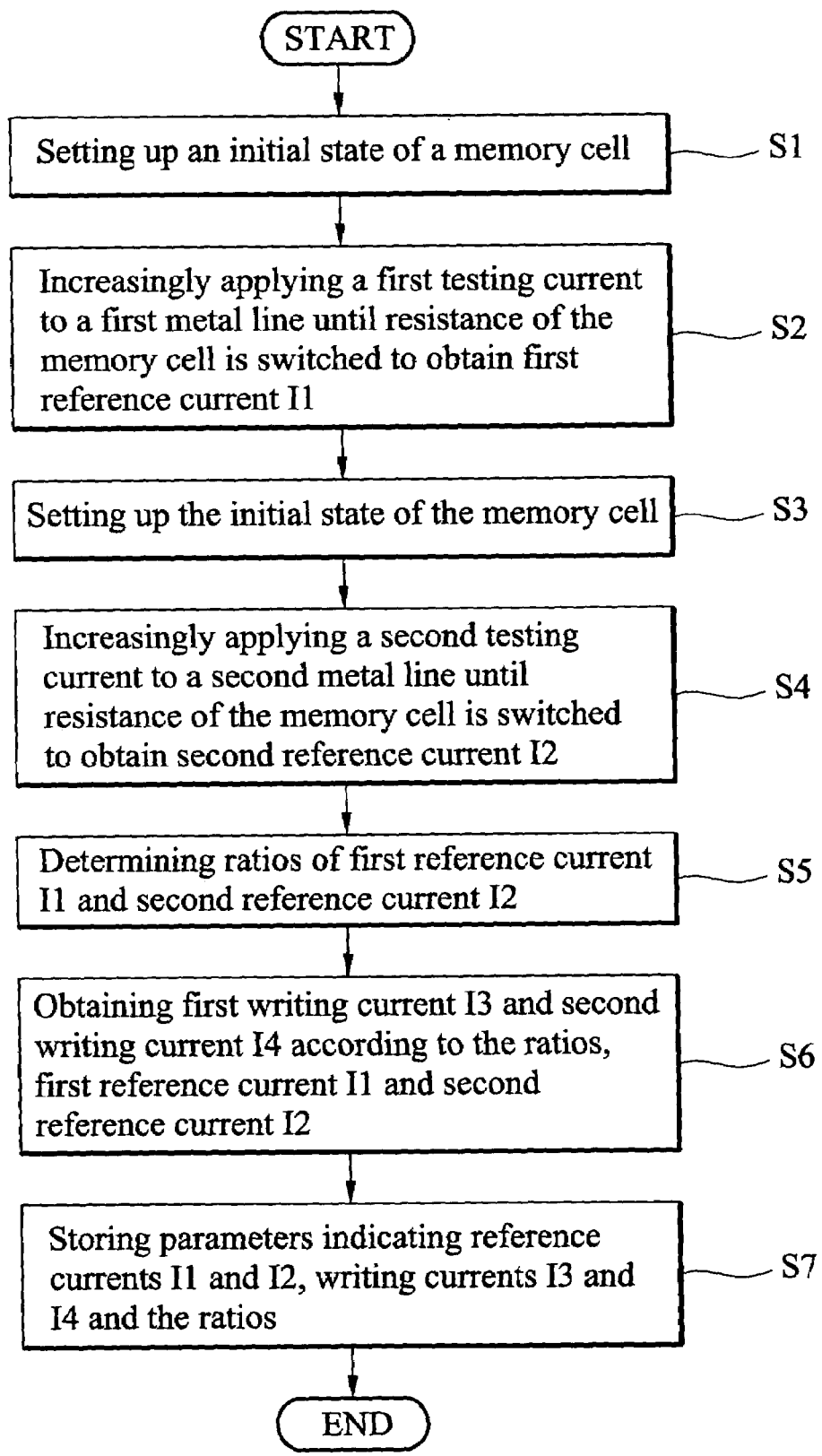
FIG. 5 is a flowchart of an embodiment of a method for determining first and second magnetic fields Msw and Msb for writing memory cells.

FIG. 5 is a flowchart of an embodiment of a method for determining the first and second magnetic fields Msw and Msb for writing memory cells, using the MTJ memory cell 40 shown in FIG. 4 as an example.

An initial state of the MTJ memory cell 40 is set up (S1), for example, a strong reverse current applied to the first operative line 41 or the second operative line 45, or both, to erase or program the MTJ memory cell 40 to store a predetermined state, "0" as an example. Note that the magnetic field generated by the current in step S1 is strong enough to switch the resistive state of the MTJ memory cell 40.

Next, a first testing current is increasingly applied to first operative line 41 only until resistance of MTJ memory cell 40 is switched to another state, "1" as an example, thus a first reference current I1 is obtained (S2). Next, the predetermined state "0" of the MTJ memory cell 40 is set up again by applying the strong reverse current as described in step S1 (S3). Next, a second testing current is increasingly applied to second operative line 45 only until resistance of MTJ memory cell 40 is switched to state "1", thus a second reference current I2 is obtained (S4). Note that the magnetic field generated by first reference current I1 or second reference current I2 can switch the resistance of the MTJ memory cell 40 individually.

Next, ratios of the first reference current I1 and the second reference current I2 are determined (S5). The range of the ratio may be between 20%~80%, preferably 50%. Next, a first writing current I3 is set according to the ratio belonging to first reference current I1 and first reference current I1, and a second writing current I4 is set according to the ratio belonging to second reference current I2 and second reference current I2 (S6), for example, first writing current I3 can be a ratio of first reference current I1, and second writing current I4 can be a ratio of the second reference current I2. Note that the ratio of the first reference current I1 and the second reference current I2 can be different values or the same, depending on real implementations.

Next, the reference currents I1 and I2 and writing currents I3 and I4 are recorded as the parameters for writing the MTJ memory cell 40 in writing operation (S7).

Figure 6:
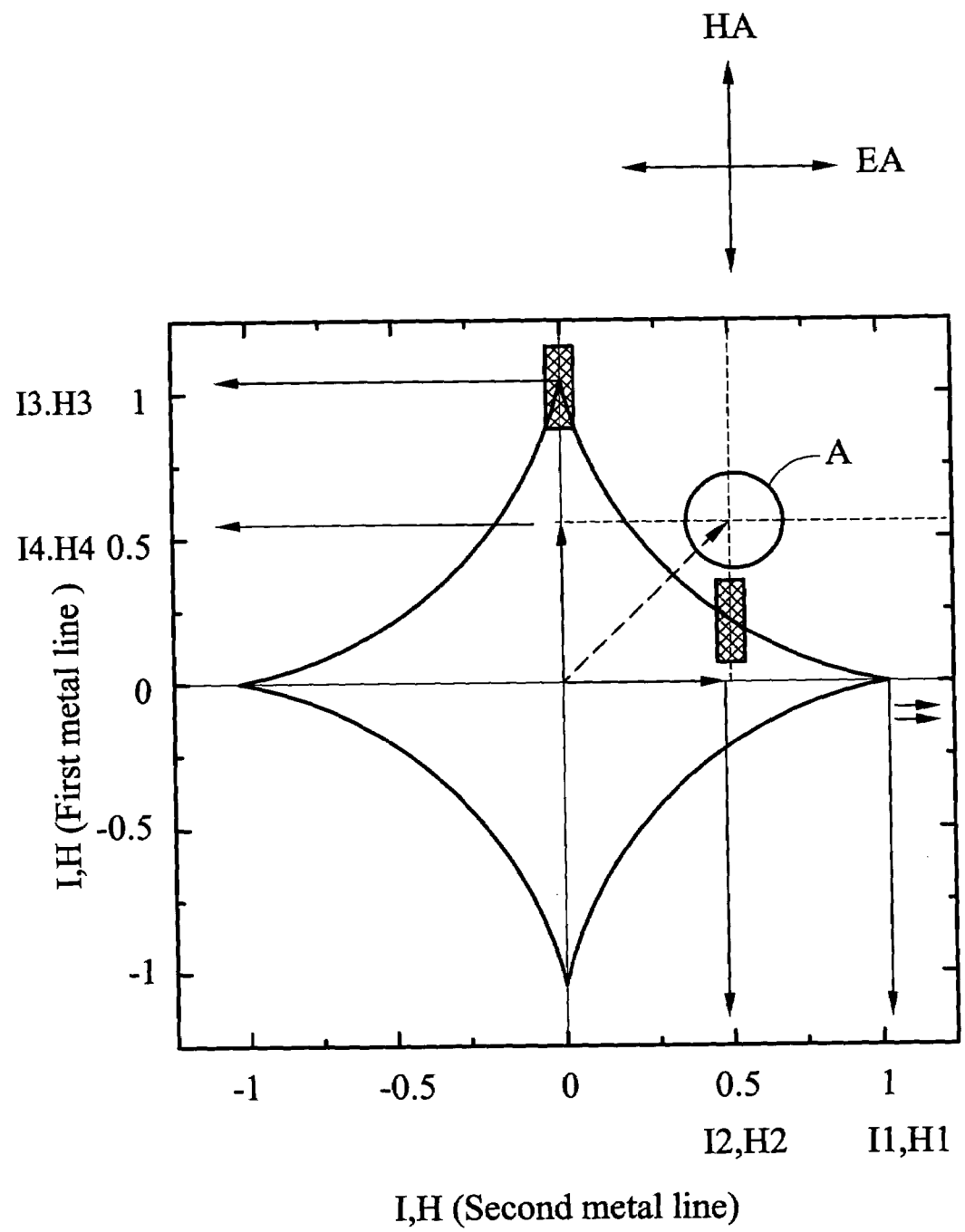
FIG. 6 is an asteroid model of the magnetic response of an MTJ memory cell 40 using the method described in FIG. 5.

FIG. 6 is an asteroid model of the magnetic response of the MTJ memory cell 40 using the method described in FIG. 5. As shown in FIG. 6, the ratios of the reference currents I1 and I2 are set as 50%, thus first writing current I3 and second writing current I4 are both half of reference currents I1 and I2, respectively. The magnetic fields generated by first writing current I3 and second writing current I4 define an operating point A, outside the asteroid, thus the resistance of the MTJ memory cell is switched by the magnetic fields generated by first writing current I3 and second writing current I4 successively.

Figure 7:
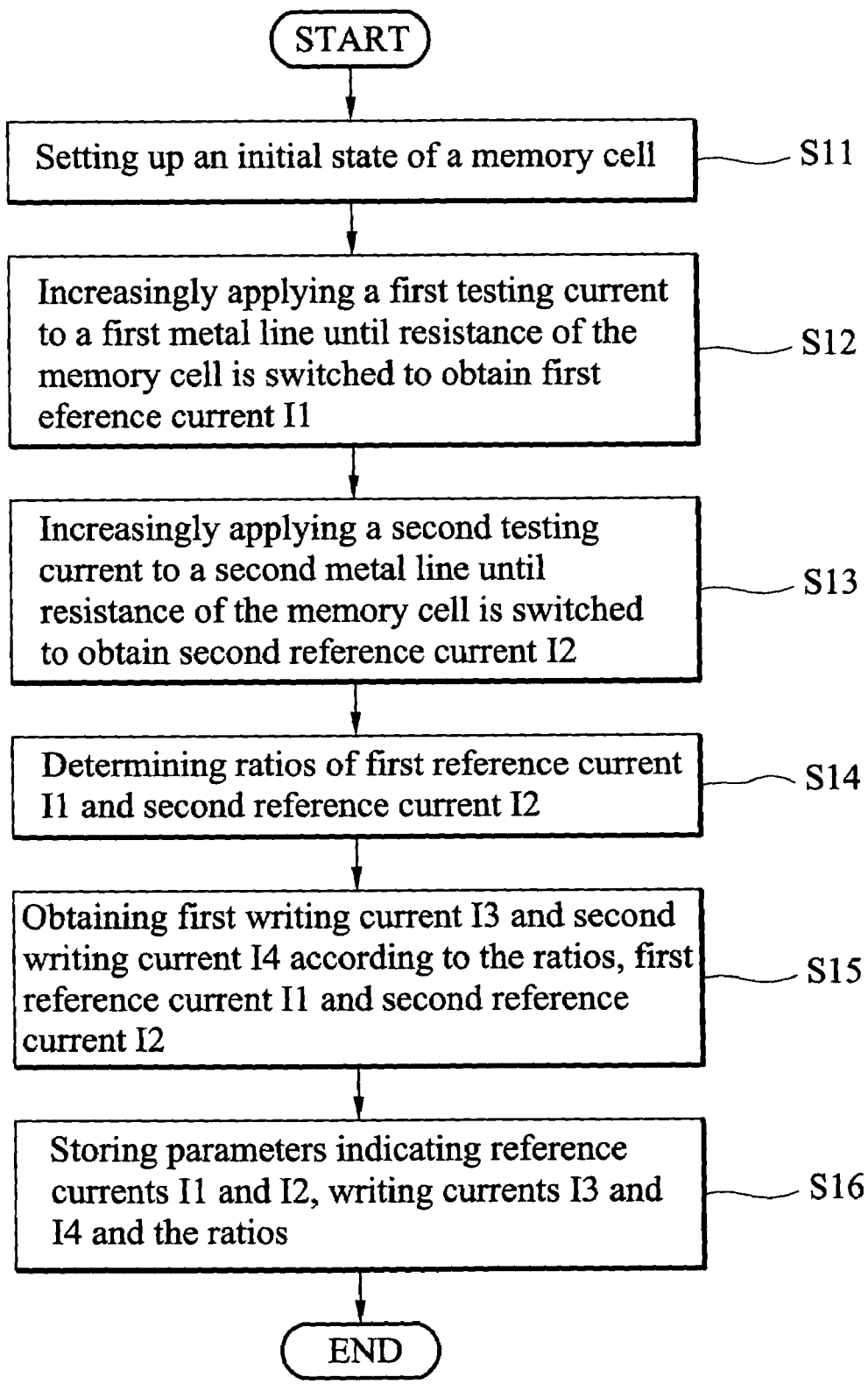
FIG. 7 is a flowchart of another embodiment of a method for determining first and second magnetic fields Msw and Msb for writing memory cells.

FIG. 7 is a flowchart of another embodiment of a method for determining the first and second magnetic fields Msw and Msb for writing memory cells, using the MTJ memory cell 40 shown in FIG. 4 as an example.

An initial state of the MTJ memory cell 40 is set up (S11), for example, a strong reverse current applied to the first operative line 41 or the second operative line 45, or both, to erase or program the MTJ memory cell 40 to store a predetermined state, "0" as an example. Note that the magnetic field generated by the current in step S1 is strong enough to switch the resistive state of the MTJ memory cell 40.

Next, a first testing current is increasingly applied to first operative line 41 only until resistance of MTJ memory cell 40 is switched to another state, "1" as an example, thus a first reference current I1 is obtained (S12). Next, a second testing current is increasingly applied to second operative line 45 only until resistance of MTJ memory cell 40 is switched to state "0", thus a second reference current I2 is obtained (S13).

Next, ratios of the first reference current I1 and the second reference current I2 are determined (S14). The range of the ratio may be between 20%~80%, preferably 50%. Next, a first writing current I3 is set according to the ratio belonging to first reference current I1 and first reference current I1, and a second writing current I4 is set according to the ratio belonging to second reference current I2 and second reference current I2 (S15), for example, first writing current I3 can be a ratio of first reference current I1, and second writing current I4 can be a ratio of the second reference current I2. Note that the ratio of the first reference current I1 and the second reference current I2 can be different values or the same, depending on real implementations.

Next, the reference currents I1 and I2 and writing currents I3 and I4 are recorded as the parameters for writing the MTJ memory cell 40 in writing operation (S16).

Figure 8:
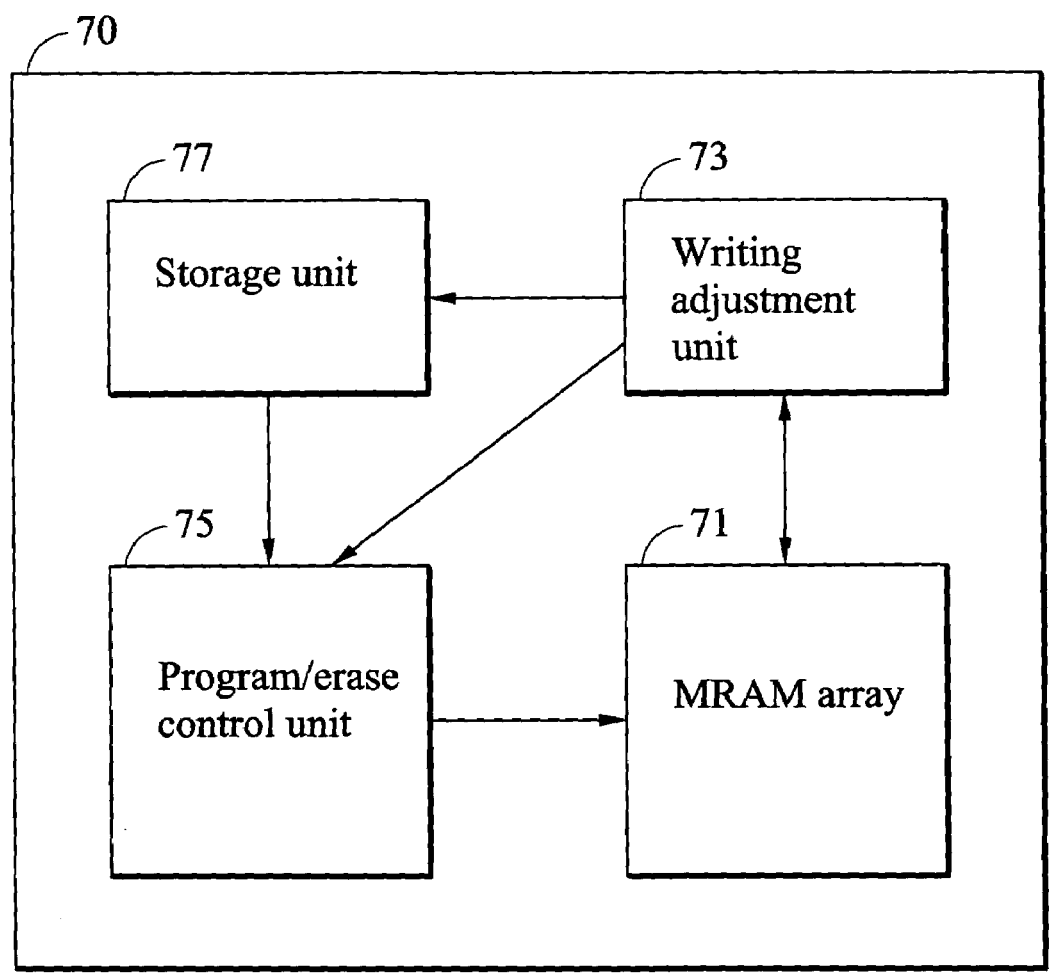
FIG. 8 is a schematic diagram of an embodiment of an MRAM memory device.

FIG. 8 is a schematic diagram of an embodiment of an MRAM memory device. The MRAM memory device 70 comprises an MRAM array 71, a writing adjustment unit 73, a program/erase control unit 75, and a storage unit 77. While FIG. 8 shows only a memory array, the MRAM memory device 70 may select predetermined bits of memory cells in a die, a memory bank, or a memory array for determination of operation point for memory writing operation.

Figure 9:
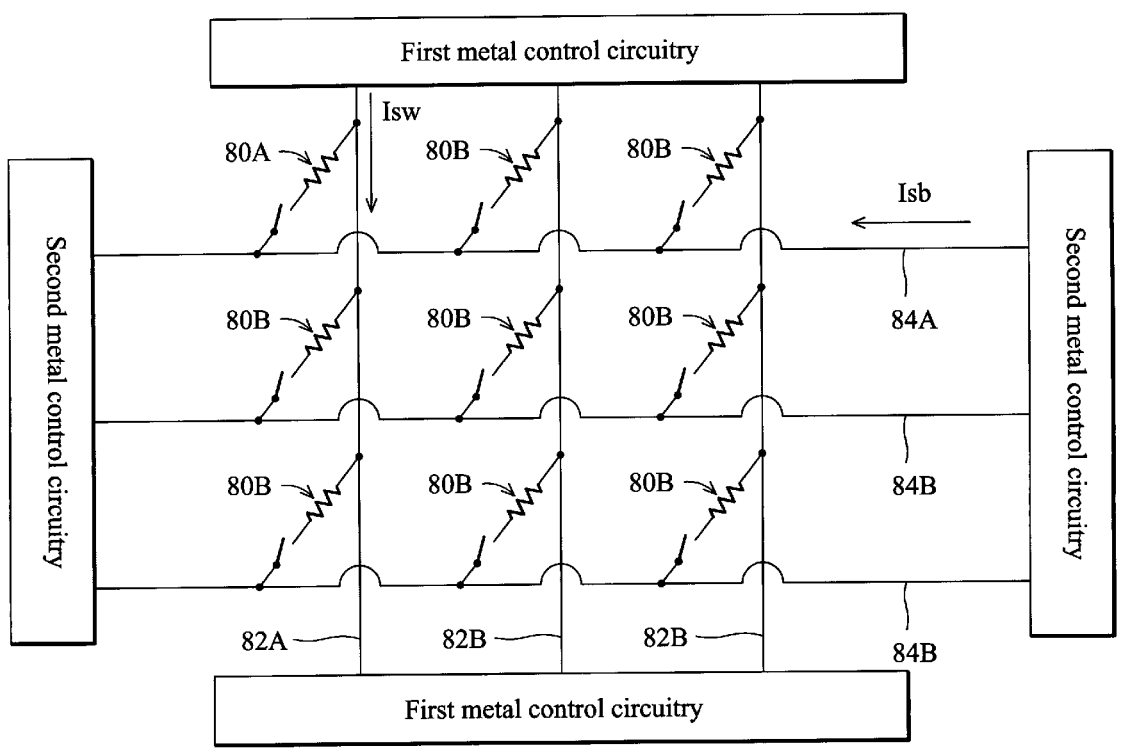
FIG. 9 is a schematic diagram of an embodiment of the MRAM array 71.

FIG. 9 is a schematic diagram of an embodiment of the MRAM array 71. A selected MTJ memory cell 80A is written by passing current Isw through first operative line 82A, and current Isb through second operative line 84A. According to the asteroid curve, the magnetic field produced by either Isw or Isb alone in the region of the MTJ memory cells is less than the magnetic field required to change the magnetic state in an MTJ memory cell, thus, half-selected MTJ memory cells 80B (those over which only Isw or Isb alone is passing) are not written. The combination of magnetic fields from Isw and Isb is, however, sufficient to change the state of selected MTJ memory cell 80A.

In a read operation, a forward bias voltage is established across the selected MTJ memory cell 80A by pulling the second operative line 84A voltage down, and raising the first operative line 82A voltage. In addition, unselected first operative lines 82B and second operative lines 84B remain at standby voltages, thus, half-selected MTJ memory cells have a zero voltage drop from second operative line to first operative line and do not conduct.

In FIG. 8, program/erase control unit 75 increasingly provides a first testing current to the first operative line until resistance of the select MTJ memory cell is switched, to obtain a first reference current. In addition, program/erase control unit 75 increasingly provides a second testing current to the second operative line until resistance of the select MTJ memory cell is switched, to obtain a second reference current. In an embodiment, an initial state of the selected MTJ memory cell is set up before providing the first testing current and the second testing current by applying a magnetic field strong enough to switch the resistive state of the select MTJ memory cell to store a predetermined state, "0" as an example. In another embodiment, the initial state of the selected MTJ memory cell is only set up before providing the first testing current applying the magnetic field strong enough to switch the resistive state of the select MTJ memory cell to store the predetermined state "0", and the second testing current is the increasingly applied to the second operative line until resistance of the select MTJ memory cell switched form "0" to "1". In addition, each magnetic field generated by first reference current or second reference current switches the resistance of the MTJ memory cell individually.

The writing adjustment unit 73 determines ratios respectively of the first reference current and the second reference current. The range of the ratios may be between 20%~80%, 50% as an example. Thus, a first writing current is obtained according to the ratio and the first reference current, and a second writing current is obtained according to the ratio and the second reference current. The parameters indicating the ratios, the first reference current and the second reference current, and the first writing current and the second writing current, can be stored in storage unit 77, which can be an individual memory or a part of the MRAM array 71.

Thus, during writing operation, program/erase control unit 75 provides the first writing current to the first operative line, and the second writing current to the second operative line to program the selected MTJ memory cell.

In an embodiment, testing current is only applied to one operative line for the adjustment of the writing magnetic field generated by this operative line, and the writing magnetic field generated by another operative line of the memory cell can be a fixed value.

In an embodiment, the method for determining writing current according to embodiments of the invention can be implemented before the memory device leaves the factory, automatically implemented in a predetermined period, or by user, to achieve a reliable nominal value.

In some embodiments, the method for determining writing current according to embodiments of the invention also can be implemented to memory cells programmed using applied energy, such as parameter RAMs (PRAM) or Ovonic Unified Memories (OUM).

The foregoing description of several embodiments have been presented for the purpose of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A memory device, comprising:
   a first operative line;
   a memory cell;
   a writing adjustment unit operative to generate a first parameter representing a first ratio of a first reference current, and generate an initial signal; and
   a program/erase control unit operative to switch the memory cell to a second state in response to the initial signal, provide the first reference current to the first operative line to switch the memory cell to a first state, and provide a first writing current according to the first ratio and the first reference current to the first operative line to switch the memory cell to the first state or the second state.

2. The memory device as claimed in claim 1, wherein the writing adjustment unit generates the initial signal before generating the first reference current.

3. The memory device as claimed in claim 1, further comprising a second operative line crossing the first operative line.

4. The memory device as claimed in claim 3, wherein the memory cell is positioned at a crossing point of the first operative line and the second operative line.

5. The memory device as claimed in claim 1, wherein the memory cell is a magnetic tunnel junction cell.

6. The memory device as claimed in claim 5, wherein the first reference current generates a first magnetic field to switch the memory cell to the first state.

7. The memory device as claimed in claim 1, further comprising a storage unit operative to store the first parameter.

8. The memory device as claimed in claim 1, wherein the first writing current is the first ratio of the first reference current.

9. The memory device as claimed in claim 6, wherein the writing adjustment unit is further operative to generate a second parameter representing a second ratio of a second reference current.

10. The memory device as claimed in claim 9, wherein the writing adjustment unit is further operative to generate the initial signal before generating the second reference current.

11. The memory device as claimed in claim 9, wherein the program/erase control unit is further operative to provide the second reference current to the second operative line to generate a second magnetic field to switch the memory cell to the first state or the second state, and provide a second writing current according to the second ratio and the second reference current to the second operative line to switch the memory cell to the second state or the first state.

12. The memory device as claimed in claim 9, wherein the storage unit is further operative to store the first parameter and the second parameter.

13. The memory device as claimed in claim 9, wherein the first writing current is the first ratio of the first reference current and the second writing current is the second ratio of the second reference current.

14. The memory device as claimed in claim 9, wherein the first ratio and the second ratio are within a range of 20%–80%.

15. A method for determining writing current for memory cells, comprising:
- applying a first reference current to a first operative line to switch the memory cell to a first state;
- applying a second reference current to a second operative line crossing the first operative line to switch the memory cell to a second state;
- obtaining a first writing current according to a first ratio and the first reference current;
- obtaining a second writing current according to a second ratio and the second reference current; and
- programming the memory cell by applying the first writing current to the first operative line and applying the second writing current to the second operative line.

16. The method as claimed in claim 15, further comprising erasing the memory cell to the second state before applying the first reference current to the first operative line.

17. The method as claimed in claim 15, wherein the first reference current is obtained by increasingly applying a first testing current until a state of the memory cell is switched.

18. The method as claimed in claim 15, wherein the second reference current is obtained by increasingly applying a second testing current until a state of the memory cell is switched.

19. The method as claimed in claim 15, wherein the memory cell is positioned at a crossing point of the first operative line and the second operative line.

20. The method as claimed in claim 15, wherein the memory cell is a magnetic tunnel junction cell.

21. The method as claimed in claim 15, further comprising generating a first parameter representing the first ratio of the first reference current and a second parameter representing the second ratio of the second reference current.

22. The method as claimed in claim 21, further comprising recording the first parameter and the second parameter.

* * * * *